(12) United States Patent
Calmidi et al.

(10) Patent No.: US 6,675,852 B2
(45) Date of Patent: Jan. 13, 2004

(54) PLATEN FOR USE IN LAMINATING PRESS

(75) Inventors: Varaprasad Venkata Calmidi, Vestal, NY (US); Donald S. Farquhar, Endicott, NY (US); Michael Joseph Klodowski, Endicott, NY (US); Randall Joseph Stutzman, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 09/882,239

(22) Filed: Jun. 15, 2001

(65) Prior Publication Data

US 2002/0189755 A1 Dec. 19, 2002

(51) Int. Cl.[7] .......................... B30B 15/06; B30B 15/34
(52) U.S. Cl. ..................... 156/359; 156/498; 156/583.1; 156/583.7; 100/326
(58) Field of Search .......................... 156/583.7, 583.9, 156/583.1, 498, 359; 100/317, 378, 326; 425/407

(56) References Cited

U.S. PATENT DOCUMENTS

| | | | |
|---|---|---|---|
| 3,594,867 A | * | 7/1971 | Pfeiffer ........................ 425/143 |
| 5,558,015 A | * | 9/1996 | Miyashita et al. ............. 100/50 |
| 5,603,871 A | | 2/1997 | Koseko et al. ................ 264/1.9 |
| 5,743,179 A | | 4/1998 | Pohl ............................ 100/325 |
| 5,840,348 A | | 11/1998 | Heiligman ................... 425/407 |
| 5,864,187 A | * | 1/1999 | Gonzalez ...................... 310/12 |
| 5,891,291 A | | 4/1999 | Okamoto et al. ......... 156/273.9 |

FOREIGN PATENT DOCUMENTS

JP    1139229 A2    5/1989

* cited by examiner

Primary Examiner—Michael W. Ball
Assistant Examiner—Todd J. Kilkenney
(74) Attorney, Agent, or Firm—William N. Hogg

(57) ABSTRACT

A platen for use in a laminating press is provided which includes a body of material having first and second faces and spaced first and second ends. Preferably, at least one heating device is disposed in the body of material. First and second spaced cooling channels are formed in the body of material, the first cooling channel being adjacent the first face and having a fluid inlet port adjacent to or in the first end, and a fluid outlet port adjacent to or in the second end, and a second cooling channel being adjacent the second face and having a fluid inlet port adjacent to or in said second end, and a fluid outlet port adjacent to or in the first end. The invention also contemplates using such platens for laminating a book or stack of sheets of material to form a unitary single member having reduced stresses.

9 Claims, 2 Drawing Sheets

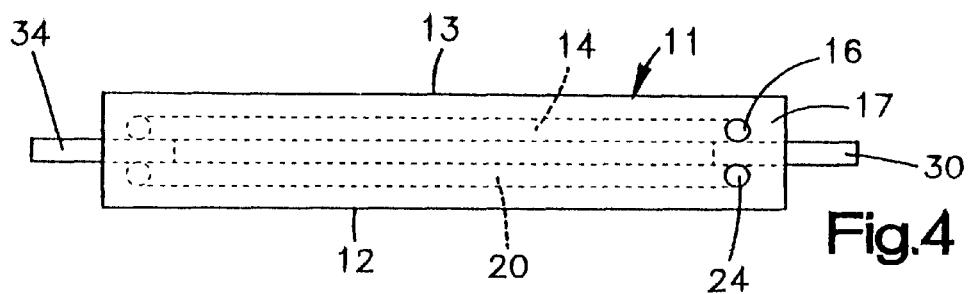
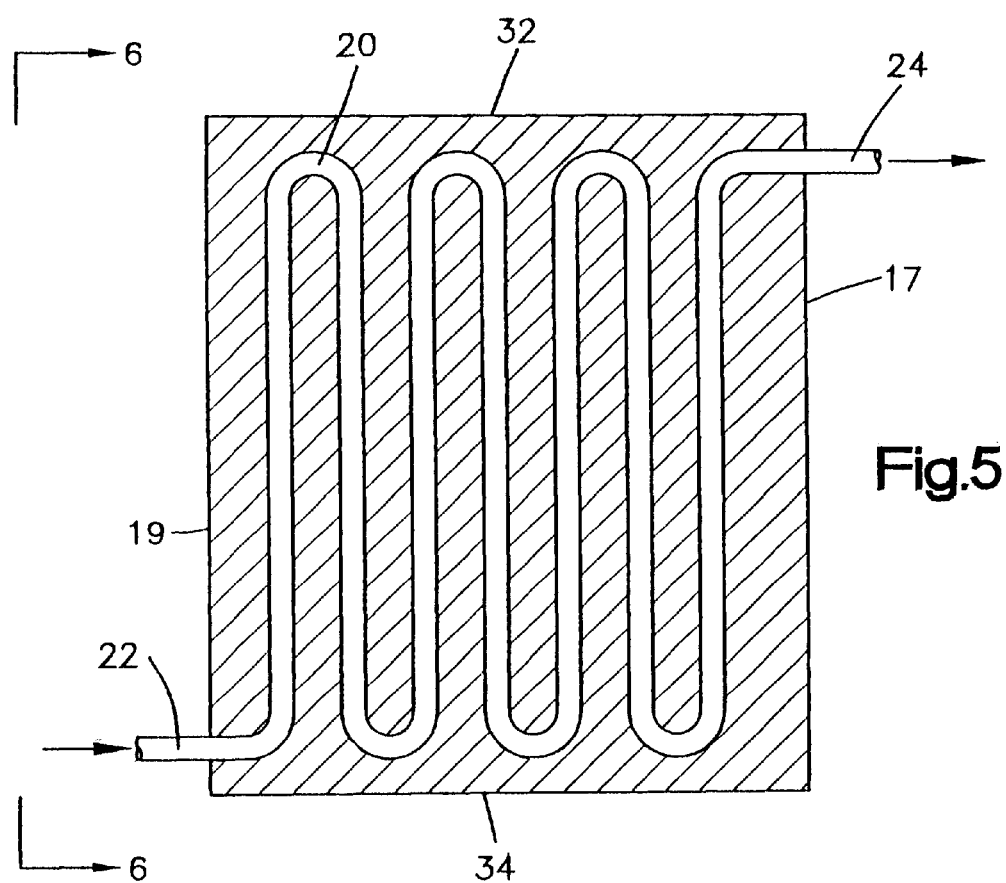
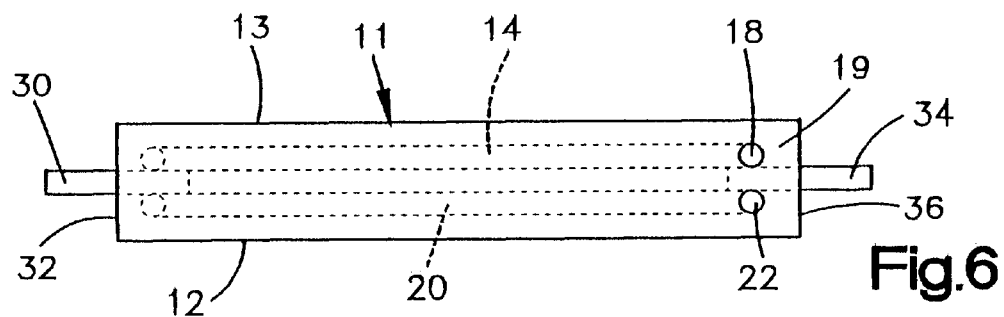

PLATEN FOR USE IN LAMINATING PRESS

BACKGROUND INFORMATION

1. Field of the Invention

This invention relates generally to platens for use in laminating presses and a method of laminating using such platens. In more particular aspects, this invention relates to an improved cooling system for platens for use in laminating presses and the use of such platens with improved cooling for lamination.

2. Background Art

In lamination operations, heat and pressure are applied to a stack of sheets of material often referred to as a book. The stack of sheets includes material which will join together under heat and pressure to form a unitary resulting product. In most lamination operations, it is necessary to control both the heating cycle and the cooling cycle to assure a proper fusing of the materials to insure a unitary finished product, and a proper cooling to minimize stresses induced in the resulting product. This is particularly important in the case of laminating materials together to form chip carriers or circuit boards. The cooling cycle is particularly important where flatness of the resulting product is required, the cooling cycle being important to minimize the induced stresses which could result in a product which becomes bowed or otherwise nonconforming to the flatness requirements. In addition, any in plane dimensional changes that occur during lamination must be linear and repeatable from day to day.

There have been several prior art proposals for platen designs which allow for cooling of the platen by passing cooling fluids through the platen. However, even these prior art proposals for cooling platens, in many instances, still permit unacceptable levels of resultant stresses after cooling.

There are three main types of lamination presses used in the fabrication of printed wiring boards (PWBs). They all use heated platens to apply heat and pressure to the product during the lamination process. Steam presses circulate fluid through the passages in the platen for both heating and cooling, and achieve very fast heat up rates and good uniformity, but are limited to peak temperatures in the range of 450° F. Hot oil presses are configured in a similar manner and have similar heating characteristics, but are limited to peak temperatures in the range of 750° F. The high heat capacity of the circulating fluid (steam or oil) allows for rapid heat transfer, even with small temperature differences between the fluid and the platen.

A third alternative is an electric press, which uses electric resistance cartridge heaters (installed in the platen for heating) and uses separate passages (like steam or hot oil passages) for circulating cooling fluids. Electric presses have several advantages, such as multi-zone control within the platen, much greater peak temperature capability, and diminished safety concerns (versus hot oil or steam). Configured with sufficient wattage heaters, very high heat up rates can be achieved and, with proper control systems, excellent temperature uniformity can be achieved. The typical installation uses up to three modes of cooling, depending on the current platen temperature: (1) air only; (2) air and water mist, and (3) water. However, uniform cooling of such presses can be problematic because the introduction of low temperature cooling fluids into the passages in the platen cools much faster at the inlet than the outlet. For example, when a press is operating at 600° F. and cooling is required, room temperature air circulating in the passages will remove heat very quickly at the inlet, but almost no heat at all in the outlet.

Therefore, it is an object of the present invention to provide an improved platen and method of laminating using such platens, which reduces stresses induced during the cooling cycle, by improving the cooling of the workpiece following the heating cycle of the lamination operation.

SUMMARY OF THE INVENTION

According to the present invention, a platen for use in a laminating press is provided which includes a body of material having first and second faces and spaced first and second ends. Preferably, at least one heating device is disposed in the body of material. First and second spaced cooling channels are formed in the body of material, the first cooling channel being adjacent the first face and having a fluid inlet port adjacent to or in the first end, and a fluid outlet port adjacent to or in the second end, and a second cooling channel being adjacent the second face and having a fluid inlet port adjacent to or in said second end, and a fluid outlet port adjacent to or in the first end. The invention also contemplates using such platens for laminating a book or stack of sheets of material to form a unitary single member having reduced stresses.

DESCRIPTION OF THE DRAWINGS

FIG. 4 is a view taken substantially along the plane designated by the line 4—4 of FIG. 3;

FIG. 5 is a sectional view taken substantially along the plane designated by the line 5—5 in FIG. 2; and FIG. 6 is a view taken substantially along the plane designated by the line 6—6 in FIG. 5.

DESCRIPTION OF THE PREFERRED EMBODIMENT

Figure 1:
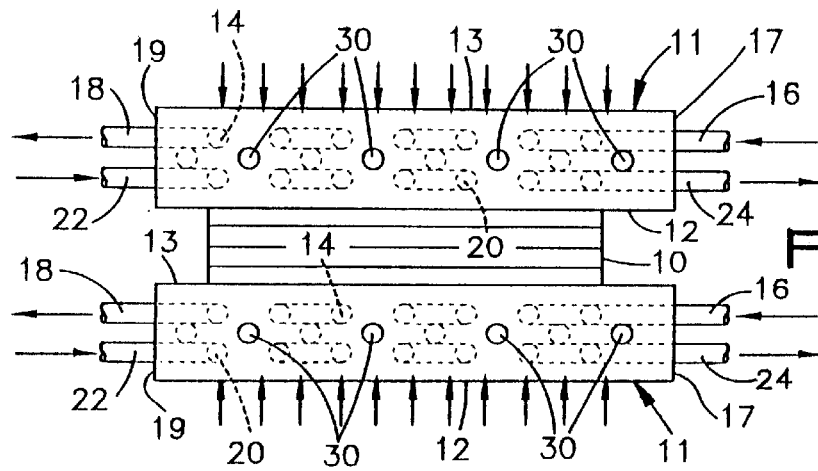
FIG. 1 is a side elevational view, somewhat diagrammatic, showing a lamination process using opposed platens, according to this invention, to laminate a book or stack of sheets of material.
Figure 2:
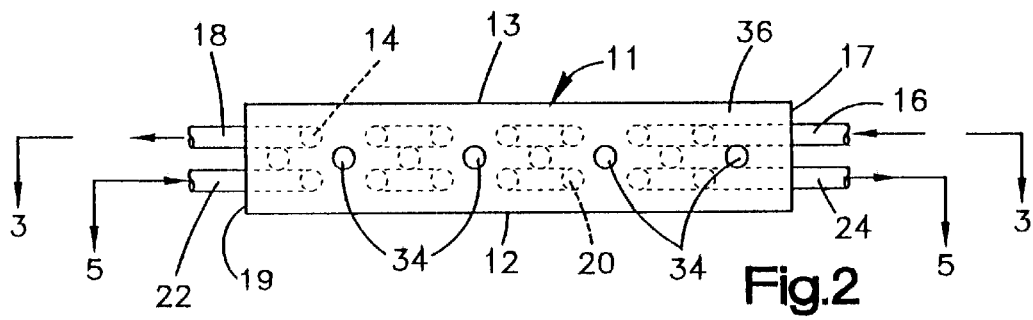
FIG. 2 is a side elevational view of the top platen shown in FIG. 1.

Referring now to the drawings, and for the present to FIG. 1, a schematic representation of the lamination of a stack or book of sheets 10 between a pair of platens 11 is shown. The platens 11 are formed according to this invention, one of which platens is shown in detail in FIGS. 2–6. Still referring to FIG. 1, the stack of materials 10 is subjected to pressure, as shown by the arrows, and heat to fuse the fusible material to form the laminated product. Following the application of pressure and heat, the platens 11 are cooled in a method, which will be described presently, in a controlled manner to minimize any stresses induced in the resulting product formed from the lamination of the book of sheets 10. While the platens and process are applicable to virtually any laminate material, they are especially useful in laminating sheets of polytetrafluoroethylene (PTFE) dielectrics to form either laminated chip carriers or circuit boards.

Referring now to FIGS. 2–6, each platen 11 includes a body of material, preferably a low carbon steel (although other materials may be used), having first and second opposed opposite faces 12 and 13. A first serpentine fluid channel 14 is provided having an inlet port 16 in face 17 and outlet port 18 in face 19. Preferably, the inlet port 16 is at the opposite end of face 17 than the outlet 18 on the face 19, as can best be seen in FIG. 3. The serpentine fluid path of the channel 14 is adjacent the face 13.

Figure 3:
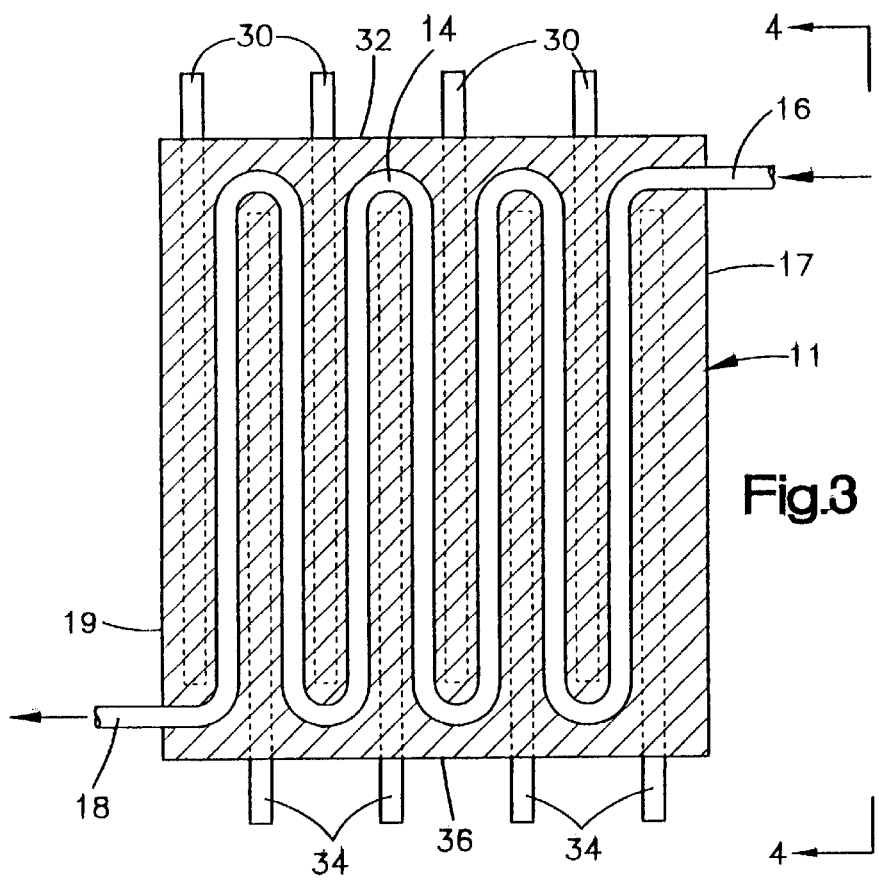
FIG. 3 is a sectional view taken substantially along the plane designated by the line 3—3 of FIG. 2.

A second serpentine fluid channel 20 is provided for a cooling fluid which is adjacent the face 12. Preferably, the channels 14 and 20 are aligned in superposed relationship. This second serpentine channel 20 has an inlet port 22 in face 19 and outlet port 24 in face 17, as can best be seen in FIG. 5. Thus, in a single platen 11, there are two serpentine pathways for fluid flow. In channel 14, the flow is from right to left as seen in the drawings, i.e. from face 17 to 19, and fluid flow in channel 20 is in the opposite direction, i.e. from left to right, from the face 19 to 17. The flow is indicated in FIGS. 1, 3 and 5 by arrows indicating inlet and outlet of the fluid flow. (As used herein, the term "fluid" includes both gas and liquid and, thus, the fluid can be water or air or a mist of water and air.)

In order to perform the heating function, preferably electric heating rods 30 are provided which extend into the body of platen 11 from face 32 and heating rods 34 which extend into the body of the platen 11 from face 36. Heating rods 30 and 34 are interdigitated within the serpentine fluid channels 14 and 20 of the platen 11.

As shown in FIG. 1, a book of sheets of material, e.g. sheets of PTFE material, are placed between two platens 11. Preferably, the platens 11 are arranged so that the fluid flow in the channels adjacent the surfaces that contact the book is in opposite directions, i.e. from left to right on one side of the book 10 and from right to left on the other side. One way of doing this is to arrange the platens so that the surface 12 of the top platen 11 and surface 13 of the bottom platen 11 contact the book 10, as shown in FIG. 1. Another way this can be accomplished is to flip one platen 11 with respect to the other platen and rotate the flipped platen 180° so that both surfaces 12 or both surfaces 13 are in contact with the book 10. This way, surfaces 12 and surfaces 13 of the platens contact the book 10 with reversed orientation. Hence, either way, there is opposite fluid flow directions on opposite sides of the book 10, which increases the uniformity of cooling, thus lessening the tendency toward increased stresses. (It is to be understood that multiple books 10 can be laminated simultaneously by providing additional platens 11. Again, it is desirable that the additional platens be arranged such that, on opposite sides of the book 10, the faces 12, 13 of the plates 11 are arranged so that, on opposite sides of the book 10, there is opposite direction of flow of the cooling fluid in channels 14, 20.

During the heating cycle, pressure is applied, as shown in FIG. 1, and the upper and lower platens 11 are heated to the desired temperature to allow the book of sheets 10 to form to a single unitary structure. Preferably, the heating is done by the heating elements 30, 34; however, other forms of heating, such as in an oven at a controlled temperature, can be utilized. Thus, the heating elements 30, 34 are desirable but not essential. After heating to the desired temperature and held for the desired time at that temperature, a cooling cycle is initiated by flowing the cooling fluid through the channels 14 and 20 of each of the platens 11. Because of the counterflow pattern and serpentine design, a much more uniform cooling profile is provided to the resulting laminate from the book 10, thus minimizing the stresses that might be induced due to unequal cooling.

Together, the first and second cooling channels 14, 20 in the counterflow configuration form a single cooling zone in the platen. In some cases, where further improvement of cooling uniformity is required, multiple counterflow cooling channels can be incorporated in a single platen to form multiple side-by-side cooling zones. For example, in the case where equivalent cooling rate and uniformity must be maintained with an increased platen size, then two or more side-by-side cooling zones may be incorporated into the platen design.

Another use of the embodiment of the counterflow platen design provides a technique to achieve improved heat uniformity during the heating cycle. Referring to FIG. 1, it is apparent that the platen is effectively insulated by the book 10 from heat loss once the temperature setpoint has been achieved. To overcome radiation and convective losses that occur at the faces and edges of the platen, additional heat is conventionally supplied by the electrical heaters 30, 34 on the perimeter of the platen. This has the tendency to increase the temperature in the central zone of the platen where there is no heat loss. To overcome this problem, circulation of a small volume of air in the counterflowing channels 14, 20 provides a small continuous and uniform cooling load that removes heat uniformly across the platen and, working in concert with the control system for the cartridge heaters, alleviates, to a great extent, the problem of heat build-up in the center of the platen.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A platen for use in a laminating press, comprising a body of material having a first face and a second face, at least one face being a laminating face, and spaced first and second ends, at least one heating device disposed in said body of material, first and second spaced cooling channels formed in said body of material, said first cooling channel being adjacent said first face and having a fluid inlet port adjacent to or in the first end and a fluid outlet port adjacent to or in the second end;

said second cooling channel being adjacent said second face and having a fluid inlet port adjacent to or in said second end and a fluid outlet port adjacent to or in the first end;

said at least one heating device being interdigitated with said first and second cooling channels.

2. The invention as defined in claim 1 wherein said first and second cooling channels are in superposed registration with each other.

3. The invention as defined in claim 1 wherein there is a plurality of heating devices disposed in said body of material.

4. The invention as defined in claim 3 wherein all of said heating devices are interdigitated with said first and second cooling channels.

5. The invention as defined in claim 1 wherein said at least one heating device is an electrical heater.

6. The invention as defined in claim 1 wherein said inlets and said outlets are in said end walls.

7. The invention as defined in claim 1 wherein each of said first and second cooling channels are serpentine in shape.

8. The invention as defined in claim 2 wherein each of said first and second cooling channels are serpentine in shape.

9. A platen for use in a laminating press, comprising a body of material having a first face and a second face, at least one face being a laminating face, and spaced first and second ends, first and second spaced serpentine-shaped cooling channels formed in said body of material in superposed registration with each other;

said first cooling channel being adjacent said first face and having a fluid inlet port adjacent to or in the first end and a fluid outlet port adjacent to or in the second end;

said second cooling channel being adjacent said second face and having a fluid inlet port adjacent to or in said second end and a fluid outlet port adjacent to or in the first end;

a plurality of electrical heating devices disposed in said body of material interdigitated with said first and second cooling channels.

\* \* \* \* \*